(12) United States Patent
Andle et al.

(10) Patent No.: US 11,181,570 B2
(45) Date of Patent: Nov. 23, 2021

(54) PARTIAL DISCHARGE SYNTHESIZER

(71) Applicant: Rosemount Inc., Shakopee, MN (US)

(72) Inventors: Jeffrey C. Andle, Rockledge, FL (US); David Lane, Beverly, MA (US); Maly Chap, Lowell, MA (US)

(73) Assignee: ROSEMOUNT INC., Shakopee, MN (US)

( * ) Notice: Subject to any disclaimer, the term of this patent is extended or adjusted under 35 U.S.C. 154(b) by 257 days.

(21) Appl. No.: 16/232,194

(22) Filed: Dec. 26, 2018

(65) Prior Publication Data
US 2019/0383872 A1   Dec. 19, 2019

Related U.S. Application Data

(60) Provisional application No. 62/685,337, filed on Jun. 15, 2018.

(51) Int. Cl.
G01R 31/14 (2006.01)
G01R 35/00 (2006.01)

(52) U.S. Cl.
CPC .......... G01R 31/14 (2013.01); G01R 35/005 (2013.01)

(58) Field of Classification Search
CPC .. G01R 31/14; G01R 31/245; G01R 31/1272; G01R 31/12; G01R 31/1227; G01R 35/005; H01J 9/42
USPC ..................................................... 324/750.3
See application file for complete search history.

(56) References Cited

U.S. PATENT DOCUMENTS

| | | |
|---|---|---|
| 3,938,034 A | 2/1976 | Japenga |
| 4,904,996 A | 2/1990 | Fernandes |
| 4,937,763 A | 6/1990 | Mott |
| 5,063,931 A | 11/1991 | Leavitt |
| 5,612,930 A | 3/1997 | Hazony et al. |
| 5,815,352 A | 9/1998 | Mackenzie |
| 5,933,012 A | 8/1999 | Bengtsson et al. |
| 6,002,260 A | 12/1999 | Lan et al. |
| 6,124,680 A * | 9/2000 | Shoji ............... H02M 7/53803 315/291 |

(Continued)

FOREIGN PATENT DOCUMENTS

| | | |
|---|---|---|
| CA | 2 192 856 | 9/2000 |
| CA | 2 455 206 | 5/2012 |

(Continued)

OTHER PUBLICATIONS

Office Action from Chinese Patent Application No. 201920428356.3, dated Nov. 7, 2019.

(Continued)

*Primary Examiner* — Farhana A Hoque
(74) *Attorney, Agent, or Firm* — Westman, Champlin & Koehler, P.A.

(57) ABSTRACT

An apparatus for generating electrical discharge includes a component that generates an electrical discharge, a measurement circuit configured to measure a magnitude of the electrical discharge, and a controller configured to control the magnitudes of the electrical discharge. A method for controlling a reference partial discharge signal in an electric power system includes generating a partial discharge for built in self test, controlling an expected discharge magnitude of the partial discharge, and includes measuring an actual discharge magnitude of the partial discharge.

36 Claims, 6 Drawing Sheets

(56) References Cited

U.S. PATENT DOCUMENTS

| | | |
|---|---|---|
| 6,172,862 B1 | 1/2001 | Jonnatti et al. |
| 6,297,642 B1 | 10/2001 | Shibahara et al. |
| 6,424,162 B1 | 7/2002 | Rokunohe et al. |
| 6,483,316 B2 | 11/2002 | Kato et al. |
| 6,577,138 B2 | 6/2003 | Zuercher et al. |
| 6,774,639 B1 | 8/2004 | Unsworth |
| 7,071,701 B2 | 7/2006 | Roman et al. |
| 7,577,535 B2 | 8/2009 | Anderson et al. |
| 7,676,333 B2 | 3/2010 | Younsi et al. |
| 7,912,660 B2 | 3/2011 | Anderson et al. |
| 8,271,213 B2 | 9/2012 | Xu et al. |
| 8,466,690 B2 | 6/2013 | Stewart et al. |
| 8,929,036 B2 | 1/2015 | Nayak et al. |
| 9,322,881 B2 | 4/2016 | Sakurai et al. |
| 9,372,221 B1 | 6/2016 | Bierman |
| 9,383,402 B2 | 7/2016 | Fukasawa et al. |
| 9,733,285 B2 | 8/2017 | Kennedy et al. |
| 9,753,080 B2 | 9/2017 | Andie et al. |
| 10,379,151 B2 | 8/2019 | Daoudi et al. |
| 10,444,273 B2 | 10/2019 | Ikegami et al. |
| 2003/0093390 A1 | 5/2003 | Onoda et al. |
| 2004/0193303 A1* | 9/2004 | Fore, Sr. .......... B65H 67/052 700/126 |
| 2005/0035768 A1 | 2/2005 | Rabach et al. |
| 2005/0194979 A1 | 9/2005 | Roman et al. |
| 2007/0059986 A1 | 3/2007 | Rockwell |
| 2007/0272827 A1 | 11/2007 | Heo et al. |
| 2008/0133154 A1 | 6/2008 | Krauss |
| 2008/0204950 A1 | 8/2008 | Zhou et al. |
| 2008/0309351 A1 | 12/2008 | Steward et al. |
| 2009/0119035 A1 | 5/2009 | Younsi et al. |
| 2009/0251308 A1 | 10/2009 | Schweitzer, III et al. |
| 2010/0072355 A1 | 3/2010 | Schweitzer, III et al. |
| 2010/0114392 A1 | 5/2010 | Lancaster |
| 2010/0271152 A1 | 10/2010 | Sabah et al. |
| 2010/0315065 A1 | 12/2010 | Durston |
| 2011/0234215 A1 | 9/2011 | Ausserlechner |
| 2011/0234362 A1 | 9/2011 | Koehler et al. |
| 2011/0249370 A1 | 10/2011 | Nayak et al. |
| 2012/0134058 A1 | 5/2012 | Pamer et al. |
| 2012/0185185 A1 | 7/2012 | Bae et al. |
| 2013/0039377 A1* | 2/2013 | Kagiwada .......... H01S 3/0014 372/57 |
| 2013/0192376 A1 | 8/2013 | Zhou et al. |
| 2013/0234726 A1 | 9/2013 | Hobelsberger |
| 2014/0270205 A1 | 9/2014 | Miller |
| 2015/0015303 A1 | 1/2015 | Sakurai et al. |
| 2015/0043310 A1 | 2/2015 | Maas et al. |
| 2015/0160098 A1 | 6/2015 | Noda et al. |
| 2015/0204936 A1 | 7/2015 | Fukasawa et al. |
| 2015/0253362 A1 | 9/2015 | Louzir et al. |
| 2015/0260778 A1 | 9/2015 | Park et al. |
| 2015/0301102 A1 | 10/2015 | Daoudl et al. |
| 2015/0317229 A1 | 11/2015 | Wade et al. |
| 2016/0161543 A1 | 6/2016 | Andle et al. |
| 2016/0209454 A1 | 7/2016 | McCammon et al. |
| 2016/0209459 A1 | 7/2016 | Tozzi et al. |
| 2016/0231375 A1 | 8/2016 | Roemer et al. |
| 2017/0038424 A1 | 2/2017 | Ikegami et al. |
| 2017/0074920 A1 | 3/2017 | Di Stefano et al. |
| 2017/0193252 A1 | 7/2017 | Ehrhardt et al. |
| 2018/0062003 A1 | 3/2018 | Luan et al. |
| 2018/0097531 A1 | 4/2018 | Kummaraguntla |
| 2018/0114688 A1* | 4/2018 | Qian .................... H01J 61/544 |
| 2018/0252760 A1 | 9/2018 | Andle et al. |
| 2018/0356357 A1 | 12/2018 | Samarao |
| 2019/0250198 A1 | 8/2019 | Kubena et al. |
| 2019/0383872 A1 | 12/2019 | Andle et al. |

FOREIGN PATENT DOCUMENTS

| | | |
|---|---|---|
| CA | 2 821 795 | 7/2012 |
| CN | 1407345 | 4/2003 |
| CN | 102193052 | 9/2011 |
| CN | 203025311 | 6/2012 |
| CN | 102621377 | 8/2012 |
| CN | 202502197 | 10/2012 |
| CN | 102934308 | 2/2013 |
| CN | 103913663 | 7/2014 |
| CN | 104914358 | 9/2015 |
| CN | 106199362 | 12/2016 |
| CN | 205880182 | 1/2017 |
| CN | 106461721 | 2/2017 |
| CN | 106772170 | 5/2017 |
| CN | 107238811 | 10/2017 |
| CN | 211653042 | 10/2020 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 24 364 | 5/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 5-107301 | 4/1993 |
| JP | 3082132 | 8/2000 |
| JP | 2002-131366 | 5/2002 |
| JP | 2004-61358 | 2/2004 |
| JP | 2011-095036 | 5/2011 |
| JP | 4840050 | 12/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | WO 2014/189975 | 11/2014 |
| WO | WO 2017/029415 | 2/2017 |

OTHER PUBLICATIONS

Notification of Transmittal of the International Search Report and the Written Opinion of the International Searching Authority from International Application No. PCT/US2019/053726, dated Dec. 17, 2019.

Office Action (including translation) from Chinese Application No. 201920428356.3, dated Apr. 10, 2020.

Office Action from Chinese Patent Application No. 201880000347.2, dated May 28, 2020 including partial translation.

Notification of Transmittal of the International Search Report and the Written Opinion of the International Searching Authority from PCT/US2018/057461, dated Apr. 18, 2019.

Notification of Transmittal of the International Search Report and the Written Opinion of the International Searching Authority from PCT/US2019/018392, dated Jun. 3, 2019.

Notification of Transmittal of the International Search Report and the Written Opinion of the International Searching Authority from International Application No. PCT/US2019/027669, dated Jul. 23, 2019.

Communication from European Patent Application No. 18712051.4, dated Sep. 18, 2019.

"Partial Discharge Theory and Applicants to Electrical Systems", by G. Paoletti et al., IEEE IAS Pulp and Paper Industry Conference in Seattle, WA, 1999.

"Advantages of Continuous Monitoring of Partial Discharges in Rotating Equipment and Switchgear", by C. Kane et al., 8 pgs.

(56) References Cited

OTHER PUBLICATIONS

"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andie et al., IEEE, 2015.
Oil, Gas, and Petrochemicals Users Group Meeting, 2012, 2 pgs.
Notification of Transmittal of the International Search Report and the Written Opinion of the International Searching Authority from PCT/US2018/020585, dated Jun. 25, 2018.
"Ubiquitous, On-Line, Partial Discharge Trending", by J. Andie et al., Electrical Insulation Conference (EIC) San Antonio, TX, Jun. 2018, IEEE, 6 pgs.
"Using Continuous Temperature Monitoring to Avoid Critical Asset Failure" by J. Andie et al., Electric Light & Power, Jul. 2015, 7 pgs.
"Partial Discharge Testing: A Progress Report" by V. Warren, PD Progress Report, IRMC 2013, 11 pgs.
"Ameren Illinois Smart Grid Test Bed Evaluation", by B. Snyder et al., Quanta Technology, LLC, 2017, 30 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al., Electrical Insulation Conference and Electrical Manufacturing & Coil Wnding Conference, Oct. 1999.
Office Action from U.S. Appl. No. 14/961,321 dated Jan. 10, 2017.
Office Action (including transiation) from Chinese Application No. 201920428356.3, dated Apr. 10, 2020.
Office Action from U.S. Appl. No. 16/227,478, dated Feb. 5, 2020.
Office Action from U.S. Appl. No. 16/580,251, dated May 14, 2021.
Office Action from Chinese Patent Application No. 201910256390.1, dated Apr. 2, 2021.
Office Action from Chinese Patent Application No. 201910256390.1, dated Aug. 12, 2021.

* cited by examiner

PARTIAL DISCHARGE SYNTHESIZER

CROSS-REFERENCE OF RELATED APPLICATION

The present application is based on and claims the benefit of U.S. provisional patent application Ser. No. 62/685,337, filed Jun. 15, 2018, the content of which is hereby incorporated by reference in its entirety

FIELD

The present disclosure relates to diagnostics of electrical components. More specifically, the present disclosure relates to a partial discharge detection system for detecting a partial discharge in such electrical components.

BACKGROUND

High voltage electrical components such as those used in power distribution and switching, use dielectric materials or other insulators to provide electrical insulation. In some instances, the insulator can completely fail leading to a discharge path through the electrical insulator. However, in other instances, a partial discharge or arc or flashover may occur through only a small portion of the insulator. Such an event does not typically immediately result in a complete failure of the electrical insulator but does lead to degradation of the component and may eventually lead to a complete failure.

Dielectrics (insulators) are specified to have a breakdown voltage (BV) well above the operational requirements to provide a margin of safety against short term transient overvoltages, localized defects and aging. Recently manufactured assets for medium and high voltage are typically tested for defects and weak spots at commissioning; however numerous aging assets have insulators of unknown quality. Furthermore, as insulators age, weak spots become weaker and defects evolve and expand. Under certain load conditions a dielectric breakdown will initiate across the defect, causing a partial arc between the conductors at different potentials and/or within cracks and voids within the dielectric.

As opposed to a complete flashover, the partial discharge does not provide a high current path between conductors. The localized fault is confined to the defect and the fault current is limited by the capacitive reactance of the remainder of the insulator thickness in series with the defect. Such defects can happen along the surface of an insulator (e.g. tracking faults) or internal to a solid insulator. A more common class of surface discharge occurs near a metal-air boundary at sharp edges. Electrons emitted from the sharp edge ionize the air, causing a corona discharge.

In any case, the breakdown of the defect causes a small, but sudden, rise in current ranging from a few milliAmperes to a few Amperes lasting for about a nanosecond. The result is a sudden discharge ranging from a few picoCoulombs to tens of nanoCoulombs. A distressed insulator could have as few as a single defect to an arbitrarily large number of defects. Where multiple defects exist, they will typically occur at unique breakdown voltages, therefor being distributed over time or phase of the line voltage.

Since the discharge is limited in intensity and confined to a defect, it is not an immediate threat to the health of the asset. However, the collapse of an electric potential through a current spike represents a highly localized dissipation of electric power. While the electric potential that collapses is a fraction of the system working voltage, it ranges from several hundred to several thousand volts and represents an instantaneous power ranging from a few Watts to a few kilowatts.

While the energy losses are not an operational concern at such low levels and time durations, the results can be problematic. Even though the total energy losses are small because of the short duration; each discharge causes additional stress to the defect, which worsens over time.

Partial discharge can be recognized by any of a number of consequences and symptoms. The discharges cause voltage or current spikes that travel along the conductors until they are dissipated—either through conductive losses, reactive dispersion, or electromagnetic radiation of energy as ultra high frequency (UHF) and very high frequency (VHF) emissions. The ultimate fate of these pulses depends greatly on the nature of the defect location. Pulses are known to travel kilometers along shielded cable since the conductor losses are low and the shielding reduces electromagnetic radiation. The most significant influence of such propagation is that the cables are low loss transmission line filters and, with increasing distance, the detectable energy is concentrated at low frequencies. If the pulses are not completely radiated or dissipated, they eventually terminate to earth as transient earth voltage (TEV) faults.

In other assets the situation is different and radiative losses are more likely. The discharges therefore often cause electromagnetic emissions at the point of discharge that can interfere with radio communications nearby if the defect is in an outdoor asset. The interference with AM radios was one of the first symptoms used to detect and identify partial discharge. Energy is also dissipated as ultraviolet and acoustic emissions if the defects are sufficiently close to an air boundary.

In addition to the energy emissions (radio waves, ultrasound, and optical) that occur during a discharge, there are visual indications of past discharges including pitted damage to conductors, deformation and discoloration of insulators from the localized heating, and deposition of oxidized material as a fine white powder.

The use of AM radios to detect the interference is a classic technique; however early versions of this method were not quantitative nor were they able to verify that the source of interference was from partial discharge as opposed to corona or conducted interference from radio equipment being radiated from connected equipment.

One of the most reliable methods for detection and analysis of partial discharge is the direct observation of the current and voltage spikes. The sudden discharge is always associated with a localized change in current with an average impulse current equal to the discharge divided by the duration of the event. Since all electrical systems have finite transmission line impedance, the current spike has a corresponding voltage spike. Using a high voltage capacitive coupler to sample the voltage pulse or a high frequency current transformer to sample the current pulse gives a nearly direct picture of the discharge. There is still some variability in the detectable pulses at accessible locations in the asset depending on the location of the defect; however, this variability is generally believed to be smaller than for other methods of detection and most analytical equipment uses this method. IEC60270 accounts for this uncertainty by referring to the calibrated scale as apparent charge. That is, it is the measured or "apparent" charge response that correlates to a reference charge injected to the equipment at a reference location. Real discharges occurring at locations other than the reference location might deviate from the reference value, and thus the apparent value, but are quantified by their apparent magnitude.

The measurement of apparent charge has several strengths, including an ability to analyze the pulse shape of each pulse and the ability to assemble a graph of the discharge events relative to the phase of the power line waveform, called phase-resolved partial discharge (PRPD).

Advanced methods add numerical analysis of the pulse shape of individual pulses to discern valid discharges from other sources of current and voltage spikes. Systems using multiple detectors can employ time of flight analysis to locate the defect.

The direct observation has significant drawbacks. The foremost is expense. While the cost of failures in the electric grid almost always outweighs the cost of prevention, analytical instruments are still too expensive to be deployed as ubiquitous, early warning systems.

Furthermore, while the detailed information is critical to determining the location and root cause of discharges, there is simply too much information for ubiquitous deployment and the SCADA (Supervisory Control and Data Acquisition) requirements would be overwhelming Finally, the coupling detectors are contact methods of measurement. While they are designed for safe operation at the rated voltages, dust, humidity, and breakdown of the nearby insulators can impair their safety over time. As permanent, early warning systems these solutions have been historically limited to extremely high value generation and transmission assets with less widespread deployment down the distribution network, where they are typically deployed after a problem is suspected.

Indirect analytical instruments measure surface transients on grounding material (transient earth voltage, TEV), high frequency current transformer (HFCT) signals, or radiated energy detected to baseband to obtain a signature of the original pulses. While indirect methods inherently lose some of the analytical information on the pulse signature, the time of flight and phase-resolved timing of the direct methods are retained. So is the overwhelming burden of data.

The indirect analytical instruments eliminate the safety concern by offering noncontact operation and are also capable of temporary installation onto live systems. The systems can also be somewhat lower cost, although typically with reduced analytical capability. Their additional drawback is a loss of calibration. The transduction of a discharge to the indirect parameter (TEV, VHF, UHF, acoustic, and optical) is not able to be quantitatively predicted so the systems are calibrated to an external stimulus and relative measurements of partial discharge are made.

Validation, calibration, and self-test instrumentation for monitoring high voltage assets for partial discharge assists in maintaining equipment and the like. Prior art instrumentation includes contact calibration of off-line, IEC60270 measurements and various square wave, rectangular wave, or radio frequency (RF) burst generators for 'calibrating' on-line probes. There is little or no correlation between the simple wave generators and partial discharge, with the most direct correlation being the use of a high slew rate square wave to calibrate an IEC60270 method.

These types of configurations do not generate a breakdown signature that can be monitored through UHF detection methods. Instead, the step change in voltage, injected through an insertion capacitor and measured through a measurement capacitor has a direct correlation to an apparent charge at the measurement point as $Q_{app}=C\Delta V$, where C is the capacitance of a coupling capacitor and $\Delta V$ is the voltage step. This type of configuration may only be used for IEC60270 equipment measuring partial discharge by detecting small voltage spikes in the power waveform through a second capacitor. Neither the calibration nor the detection directly measures partial discharge at the point of electrical failure, but instead only measure an apparent charge.

On-line measurement systems are not able to be used as on-line, built-in self-test (BIST) and the process of calibrating the systems requires adding and removing connections.

SUMMARY

A system of one or more computers or controllers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes an apparatus for generating electrical discharge, including a component that generates an electrical discharge, a measurement circuit configured to measure a magnitude of the electrical discharge, and a controller configured to control the magnitudes of the electrical discharge. Other embodiments of this aspect include corresponding computer systems, apparatus, and computer programs recorded on one or more computer storage devices, each configured to perform the actions of the methods.

Implementations may include one or more of the following features. The apparatus where the controller is further configured to correct a magnitude of a subsequent discharge based on a measured magnitude of a previous discharge. The apparatus where the component that generates an electrical discharge is a gas discharge tube. The apparatus and further including an switched inductance, where the electrical discharge is generated by the switched inductance applying a voltage impulse to the gas discharge tube. The apparatus and further including a resistance element coupled in series between the switched inductance and the gas discharge tube, where the magnitude of the electrical discharge is controlled by adjusting a resistance of the resistance element. The apparatus and further including a shunt capacitance element coupled in parallel with the gas discharge tube, where the magnitude of the discharge is controlled by adjusting a capacitance of the shunt capacitance element. The apparatus and further including a capacitance element coupled in series with the gas discharge tube, where the magnitude of the discharge is controlled by adjusting a capacitance of the capacitance element. The apparatus where the capacitance element is coupled between the gas discharge tube and a return path of the discharge. The apparatus where the capacitance element is an integrating capacitance. The apparatus and further including: a stepped dc voltage source; and a resistance element coupled in series between the stepped dc voltage source and the gas discharge tube; where the controller is further configured to generate the discharge by applying the stepped dc voltage through the resistance element to the gas discharge tube. The apparatus where the controller is further configured to control the magnitude of the discharge by varying the stepped dc voltage. The apparatus where the magnitude of the discharge is controlled by adjusting a resistance of the resistance element. The apparatus and further including a shunt capacitance element coupled in parallel with the gas discharge tube, where the magnitude of the discharge is controlled by adjusting a capacitance of the shunt capacitance element. The apparatus and further including a capacitance element coupled in series with the gas discharge tube, where the magnitude of the discharge is controlled by adjusting a capacitance of the capacitance element. The apparatus where the measurement circuit includes a sense resistor in a discharge path of the electrical discharge. The apparatus where the measurement circuit includes a hall sensor in a discharge path of the electrical discharge. The apparatus where the measurement circuit includes an integrating capacitance in a discharge path of the electrical discharge. The apparatus and further including: a first current minor having an input coupled to a discharge path of the component that generates the electrical discharge. The apparatus may also include a sensor, the sensor coupled to an output path of the first current minor, the sensor sensing a magnitude of the electrical discharge. The apparatus where the measurement circuit includes a sense resistor coupled to the discharge path. The apparatus where the measurement circuit includes a hall sensor measuring electrical discharge in the discharge path. The apparatus where the measurement circuit includes an integrating capacitance in the discharge path. The apparatus and further including: a second current minor having an input coupled to a reference capacitance matching a capacitance of the component that generates the electrical discharge; and a reference sensor, the reference sensor coupled to an output path of the second current minor, the reference sensor sensing a magnitude of the electrical current in the reference capacitor without electrical discharge; and a meter coupled to the sensor and the reference sensor, the meter generating a difference between a magnitude at the output path of the first current minor and the output path of the second current minor. Implementations of the described techniques may include hardware, a method or process, or computer software on a computer-accessible medium.

Another general aspect includes a system, including an electric power system including a partial discharge measurement component, and an apparatus configured to generate electrical discharges. The apparatus includes a component that generates an electrical discharge, a measurement circuit configured to measure a magnitude of the electrical discharge, and a controller configured to control the magnitudes of the electrical discharge. Other embodiments of this aspect include corresponding computer systems, apparatus, and computer programs recorded on one or more computer storage devices, each configured to perform the actions of the methods.

Implementations may include one or more of the following features. The system where the controller is further configured to perform a built-in self-test calibration process of measurement instruments integral to the system by: sequentially instructing the apparatus to perform a self-test of the larger system and its measurement systems by generating and internally measuring an electrical discharge at a predetermined level in a predetermined pattern. The system may also include internally measuring a response to the self-test electrical discharge with the measurement circuit. The system may also include externally measuring a system response to the internally measured discharge. The system may also include determining a calibration state of the external measurement circuit. The system may also include using the calibration state to adjust the external measurement circuit. Implementations of the described techniques may include hardware, a method or process, or computer software on a computer-accessible medium.

Another general aspect includes a method for controlling a reference partial discharge signal in an electric power system, including generating a partial discharge for built in self test; and controlling an expected discharge magnitude of the partial discharge. The method also includes measuring an actual discharge magnitude of the partial discharge. Other embodiments of this aspect include corresponding computer systems, apparatus, and computer programs recorded on one or more computer storage devices, each configured to perform the actions of the methods.

Implementations may include one or more of the following features. The method and further including adjusting the actual discharge magnitude by adjusting the expected discharge magnitude in response to internally-measured actual discharge magnitude. The method and further including correcting a magnitude of a subsequent discharge based on a measured magnitude of one or more previous discharges. The method where generating a partial discharge includes generating with a gas discharge tube. The method where controlling the expected discharge magnitude includes generating the partial discharge with a switched inductance applying a pulse to the gas discharge tube. The method where controlling an expected discharge magnitude includes adjusting a resistance of a resistance element coupled in series between the switched inductance and the gas discharge tube. The method where controlling an expected discharge magnitude includes coupling a shunt capacitance element in parallel with the gas discharge tube and adjusting a capacitance of the shunt capacitance element. The method where controlling an expected discharge magnitude includes coupling a capacitance element in series with the gas discharge tube and controlling the magnitude of the discharge by adjusting a capacitance of the capacitance element. The method and further including integrating the discharge current with the capacitance element. The method where controlling the expected discharge magnitude includes: providing a stepped dc voltage source; providing a resistance element coupled in series between the stepped dc voltage source and the gas discharge tube; and generating the partial discharge applying the stepped dc voltage through the resistance element to the gas discharge tube. The method and further including controlling the magnitude of the partial discharge by varying the stepped dc voltage. The method and further including controlling the magnitude of the partial discharge by adjusting a resistance of the resistance element. The method and further including controlling the magnitude of the partial discharge by adjusting a capacitance of a shunt capacitance element coupled in parallel with the gas discharge tube. The method and further including controlling the magnitude of the partial discharge by adjusting a capacitance of a capacitance element coupled in series with the gas discharge tube. The method where the capacitance element is coupled between the gas discharge tube and a return path of the discharge. The method and further including integrating a discharge current from the gas discharge tube with the capacitance element. The method and further including: coupling an input of a first current mirror to a discharge path of the gas discharge tube; and sensing a magnitude of the partial discharge at an output path of the first current mirror. The method and further including: coupling an input of a second current mirror to a reference capacitance matching a capacitance of the gas discharge tube; sensing a magnitude of the current flowing in the reference capacitor in the absence of partial discharge at an output path of the second current mirror; and determining a difference between the sensed magnitude at the output path of the first current mirror and the sensed magnitude at the output path of the second current mirror.

DETAILED DESCRIPTION

Embodiments of the present disclosure provide calibration of partial discharge monitoring circuitry by performing as self-test circuitry. Embodiments of the present disclosure create a reproducible electrical discharge with controlled discharge magnitude and breakdown voltage of the discharge. Embodiments of the present disclosure provide internal measurement of the generated discharge, allowing calibration of the partial discharge monitoring circuitry or confirmation of its valid operation. Further, embodiments of the present disclosure that create true electrical discharge are compatible with measurement techniques such as IEC62070.

One prior art calibration method uses a switched inductance configuration to generate a high voltage transient and a gas discharge tube (GDT) to create an alleged known amount of discharge. This discharge is determined by the GDT capacitance and the breakdown voltage (BV). Such a configuration has been used, off-line, in an open loop mode. However, there are several problems with this technique.

1) The BV is a strong function of the voltage slew rate, dV/dt, and varies from sample to sample. This makes the calibration signal less reproducible, making the approach less reliable.

2) The BV changes over the age of the GDT, exacerbated by more rapid aging at higher BV, making the approach less reliable.

3) There is no indication of a GDT failure when it occurs. Because of this, a user might believe that the output is correct even though the GDT generates no discharge, or generates discharge at a very different magnitude.

4) Correlating the discharge to IEC methods is difficult at least because the inductive transient used to generate the voltage spike may be detected as partial discharge by many systems at levels much higher than the actual discharge tube event.

Embodiments of the present disclosure provide a variety of approaches to generating actual discharges of reproducible magnitude, to allow for built-in self test (BIST), calibration, and validation of the monitoring systems in electric power equipment. The embodiments described herein offer a calibration system and method with at least the following advantages:

1) Operation may be performed under the control of a distributed control system (DCS), supervisory control and distributed automation (SCADA), or a local intelligent electronic device (IED).

2) Embodiments of the disclosure may be located permanently at strategic points in an electric power system.

3) Embodiments of the disclosure are able to generate controlled and measurable amounts of true discharge activity in a predetermined pattern for a predetermined duration.

One embodiment modifies and expands on the prior art method of generating partial discharge using switched inductanceing as discussed above. Embodiments of the present disclosure provide improvements to the inductive systems of the prior art that utilize a flyback transformer by providing at least the following improvements and modifications:

1) Control of the discharge magnitude of the GDT.

2) Measurement of the actual discharge magnitude of the GDT.

In particular, one embodiment is directed to a method of using measurement of the actual discharge magnitude of the GDT to control the discharge magnitude of the GDT, allowing reproducible calibration of a system monitoring apparatus.

The prior art uses application of a fast, high voltage ramp from a flyback transformer, applied through a resistor to a gas discharge tube, in which the resistor was intended to block other ringing of the flyback transformer from looking like low frequency partial discharge.

A gas discharge tube (GDT) has a small capacitance, on the order of 1 picoFarad (pF) with circuit parasitic capacitance, and a reproducible breakdown voltage (BV) that depends on the voltage rise rate. For example, a GDT may break down at 90 Volts (V) for extremely slow ramp rates (resulting in 90 picoCoulombs (pC) of discharge) but might break down at 300V at a ramp rate of 100V/microsecond (µs) (300 pC) and at 600V for a ramp rate of 1000V/µs (600 pC).

Figure 1:
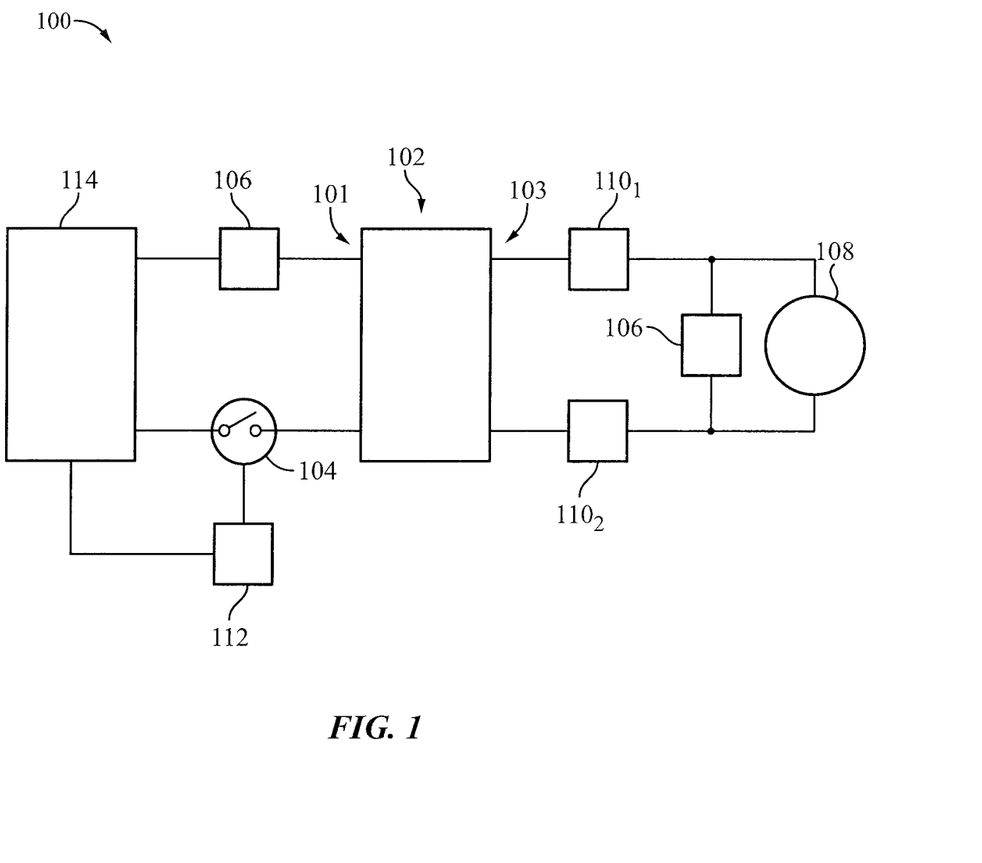
FIG. 1 is a block diagram of a circuit on which embodiments of the present disclosure may be practiced.

One embodiment 100 of the present disclosure is shown in FIG. 1. In this embodiment, a resistor coupled in series with the GDT (and therefore the tube capacitance) determines an RC time constant, which can be used by varying the resistance to adjust the ramp rate. FIG. 1 is a block diagram of a basic circuit 100 on which embodiments that allow control of the discharge magnitude of the GDT may be practiced. Circuit 100 includes a flyback transformer 102 having a primary side 101 coupled between a switch 104 for triggering operation of the flyback transformer 102 by connecting power source 114 under control of switch 104 by microcontroller/microprocessor 112 and a parallel capacitance element 106. The secondary side 103 of the flyback transformer 102 is coupled to a gas discharge tube (GDT) 108 via a pair of inductive/resistive elements $110_1$ and $110_2$. A capacitance element 106 is connected in parallel with the GDT 108.

In one embodiment of the disclosure using a circuit such as circuit 100, a resistance value of an inductive/resistive elements $110_1$ and $110_2$ are varied to facilitate adjustment of the breakdown voltage. In this embodiment, the resistance between an inductive element in series with the capacitive GDT is modulated.

In another embodiment, the energy that is applied to the flyback transformer 102 is changed by varying a combination of the charging voltage and time to influence the breakdown voltage.

In this embodiment, a microprocessor 112 and MOSFET 104 are used to control the charge time and repetition pattern of the flyback transformer 102's primary 101. This allows the system 100 to create a secondary pulse of a reasonably reproducible peak voltage and ramp rate. This in turn provides an open loop system with programmable and reproducible discharge voltage and charge. The system is non-contact and produces broadband UHF signatures that are detectable by UHF, transient electromagnetic voltage (TRV), transient magnetic field sensors, and by IEC60270 instruments.

This embodiment uses the existing flyback transformer 102 primary-side 101 drive voltage or drive time in a charging phase to modulate the stored energy. The stored energy is the square of the time integral of the applied voltage divided by the primary inductance ($L_{in}$). For simplicity, a constant input voltage is assumed and the injected energy is $V_{in}^2 t^2 / 2L_{in}$.

The slew rate is directly proportional to the peak voltage in the absence of a discharge event and the peak voltage is proportional to the square root of the energy inserted into the primary 101 during the charging phase. The resonant circuit of the secondary 103, coupling circuit ($110_1$ and $110_2$), and the GDT 108 determine the waveform of the secondary voltage. The amount of stored energy to be discharged is proportional to a term based on the impulse response, $C_{wave}$, and the peak voltage ($V_{pk}$) squared. $V_{in}^2 t^2 / L_{in} = C_{wave} V_{pk}^2 / 2$.

Figure 2:
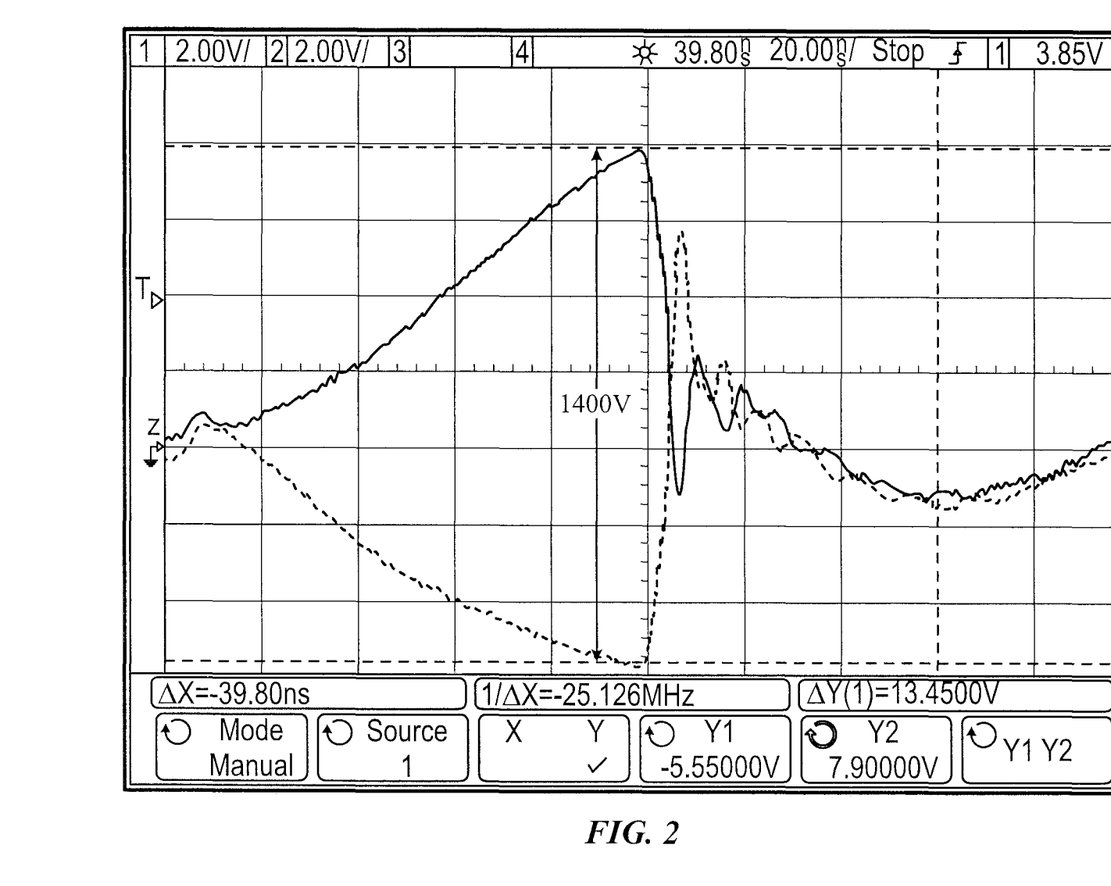
FIG. 2 is a graph showing prior art voltages for a discharge system.

The resonant impulse response of the flyback transformer 102 secondary 103 may be used to determine a normalized slew rate of the voltage at the initial leading edge, k, which is normalized to the peak voltage. The ideal slew rate of the leading edge is therefore $kV_{pk} = V_{in} t / \sqrt{(C_{wave} L_{in})}$. In one embodiment, a slew rate of 1.4 kV/100 nanoseconds (ns) (14 kV/μs) results in a very high BV on the order of 1200V and a breakdown slew rate of 1400V/5 ns or 280V/ns, as shown in FIG. 2. Adding series resistance (in the faun of inductive/resistive elements $110_1$ and $110_2$ or simply resistance elements) between the flyback transformer 102 secondary 103 and the DGT 108 slows the slew rate and reduces the BV.

Another embodiment for modulating the discharge is to modulate a capacitance 106 coupled in parallel with the GDT 108, being additive to the capacitance of the GDT and proportionately increasing the discharge at a given BV. While this option might also reduce the slew rate and therefore the BV, it will increase the charge, which is $Q_{dis} = (C_{GDT} + C_{EXT}) * BV$.

The configurations described above allow control of the discharge magnitude of the GDT, since the control circuit 112 may vary the time at which a constant voltage is applied, the voltage applied for a constant time, or a combination of voltage and time. Modification of the secondary-side circuit $110_1$, $110_2$, and 106 parameters, e.g. the series resistance, series inductance, or parallel capacitance, is also possible. However, there are safety and linearity concerns with electronically variable resistances or capacitances through large, fast transients and conflicting behavior where increasing capacitance reduces BV.

Once the discharge magnitude of the GDT is controlled, as discussed above, self-measurement of the actual discharge magnitude of the GDT may be determined. This is accomplished in one embodiment by measurement of the current flowing through the GDT 108. The integral of the current during the breakdown event is a direct measurement of the discharge magnitude. Methods to detect the current include the use of a sense resistor to convert the current (~500 pC/5 ns is ~0.1 A) to a voltage. However, measuring the waveform at a speed sufficient to allow digital integration is difficult and expensive. A peak hold circuit may be used in one embodiment, and the peak current is correlated to the discharge.

A simpler method is to use an integrating capacitor in series with the GDT. Before the breakdown, the GDT and the integrating capacitor form a capacitive voltage divider with the voltage across the integrating capacitor just before breakdown being $V_{INT} = (C_{PAR} + C_{GDT}) / (C_{PAR} + C_{INT} + C_{GDT})$ *BV. Immediately after the discharge, the charge, $(C_{GDT} + C_{PAR})*BV$ is transferred to $C_{INT}$ and $V_{INT}$ increases by $(C_{PAR} + C_{GDT}) / C_{INT} * BV$. The integration capacitor is much larger than either the GDT or external capacitor, and the voltage change can be scaled into a range suitable for an ADC.

Ideally, the flyback circuit 100 seeks to isolate the secondary 103 completely from the primary 101. This is done both to reduce voltage stresses in the transformer 102 and other insulation and to keep the large transients isolated from the control circuitry. The use of an integrating capacitance would configure one node of the capacitor at control system ground or isolate the ADC from the control system. There are significant challenges with MSa/s ADCs and isolation circuits and there are also significant challenges with ground bounce due to the high transients of the inductive element.

Figure 3:
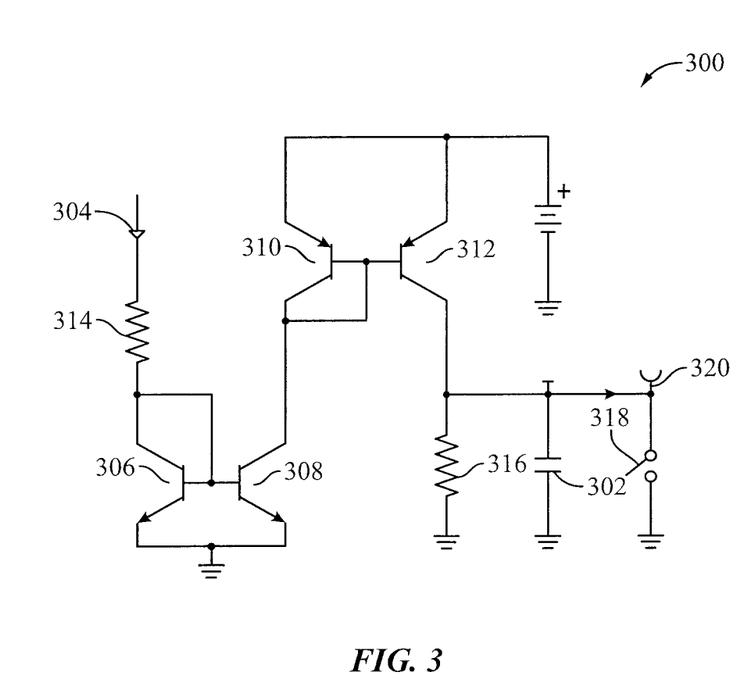
FIG. 3 is a diagram of a circuit according to an embodiment of the present disclosure.

Since it is not desirable to directly measure the voltage on the GDT and since there are concerns with transients when measuring the current directly, a buffering solution as shown in FIG. 3 is employed in one embodiment. Configuration 300 uses an integrating capacitor 302 on a distal side of a current mirror 300 from the GDT 108, the current minor 300 coupled to receive current at 304 from the GDT 108. Sinking the GDT 108 current at 304 into first transistor 306 produces an image current in transistor 308. The same current is sourced by transistor 310 and an image of that current is sourced by transistor 312 into integrator 302. Resistor 314 optionally limits the peak current at the expense of slew rate (frequency bandwidth) of the discharge from GDT 108. With 1-5 pF of total capacitance (GDT and parallel) and 1-5Ω of series resistance from resistor 314, the RC time constant does not significantly impact the response rate.

The collector of transistor 312 is coupled to a parallel configuration of integration capacitor 302, an optional bleed resistor 316, and switch 318. Switch 318 is used in one embodiment to reset the integration after a discharge. Node 320 is a measurement point that connects to the ADC. In one embodiment, a power supply for transistors 310 and 312 matches the power supply of the analog to digital converter (ADC) and a microcontroller unit (MCU) for the system. The transfer efficiency of the current minors in circuit 300 is reproducible. This allows for the protection of the input transistor 306 from transients while using the current minors (306/308 and 310/312) to reduce the influence of transients into the measurement circuitry. In one embodiment, one node of the secondary may be connected to primary ground. A sensor is coupled to an output path of the first current mirror, the sensor sensing a magnitude of the electrical discharge.

The embodiments described above address layout challenges associated with ground bounce and digital circuit reliability due to the extremely high transients of the inductive circuit and the relatively high BV associated with the high slew rate. Furthermore, the high transients stress components that impact safety considerations and make electromagnetic compatibility issues more challenging are addressed. Finally, the high BV resulting in discharges in the 400-10000 pC range, which significantly above the levels that customers might want to demonstrate in a system test, are also addressed. This embodiment and implementation is suitable for adding the aspects of control and measurement to the inductive discharge generator.

In accordance with another embodiment, instead of using fast transients to generate high BV as described above, a slowly ramped voltage is used to obtain breakdown at a lower voltage. For example, a B88069X5151B502 GDT from Epcos has a nominal DC breakdown of 90V, but the BV can be as high as 450V at 100V/μs and 600V at 1000V/μs. One inductive embodiment provides a nominal 12,000V/μs without resistive limiting, which is reduced to ~1000V/μs with resistors. Choice of ramp rates and an amount of resistive limiting may be employed to choose consistent discharge levels.

In another embodiment, an alternate approach uses a DC voltage applied to a series resistance and the sum of the paralleled external capacitance and GDT. The slew rate is determined by the RC time constant of the resistance and combined capacitance, and the discharge magnitude is determined by the product of the BV and the paralleled capacitances. Values as low as 1 pF and 150V are practical, bringing the calibrator more in line with typical "inception voltage" tests at 100 pC.

Figure 4:
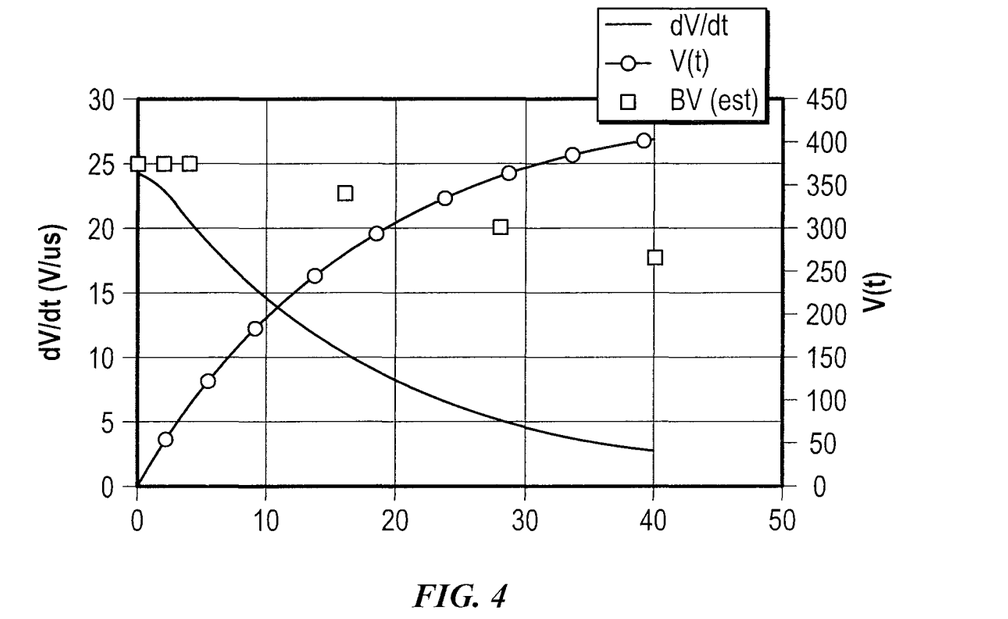
FIG. 4 is a graph of relationships between ramp rate, voltage, and breakdown voltage for high RC constant systems.

In yet another embodiment, an RC time constant and a variable magnitude step function DC voltage drive are used. In one embodiment, for example, a low RC time constant and a high DC voltage are used. The GDT is known to trigger at a nominal voltage of 350V with a slew rate of 100V/μs. However, at such a high slew rate, the stepped waveform, itself, may be considered to be partial discharge by some analyzers. Additionally, the resulting 350 pC may be higher than desired. An RC value of ~17.5 μs results in a slew rate of <20V/μs, which results in a lower trigger voltage, or allows for a GDT with a higher breakdown voltage at 100V/μs. As shown in graphical form in FIG. 4, the BV for one GDT is estimated (squares) for this RC time constant and a 450V step. In FIG. 4, a high RC constant provides a rising $V_{GDT}$ passing through substantially constant BV. Changes in DC voltage have a small effect on BV and changes in RC time constant are used to modulate the discharge.

If the resistance is 8.75 MΩ from 450V, then the initial current would be ~50 μAmperes (μA), dropping to about 15 to 20 μA at the point of discharge. The 2 pF capacitance would be at about 320V and would discharge about 640 pC in nanoseconds (~0.64 Apk). This result is similar to the inductive embodiment described above, except that the peak voltages are 450 VDC and the transients are low other than the discharge itself.

If the RC time constant were reduced to 10 μs (5 MΩ and 2 pF) and the driving voltage reduced to 300V, breakdown would occur at about 25 μs and 270V. The peak supply current would be 60 μA and the discharge would be 540 pC. At RC=5 μs (2.5 MΩ and 2 pF) with a 250V source, breakdown occurs at ~240V (480 pC) and the initial current is 100 μA compared to the ~0.48 Apk discharge. In these examples, the voltage is rising at a relatively high slew rate, crossing a relatively constant BV line.

Figure 5:
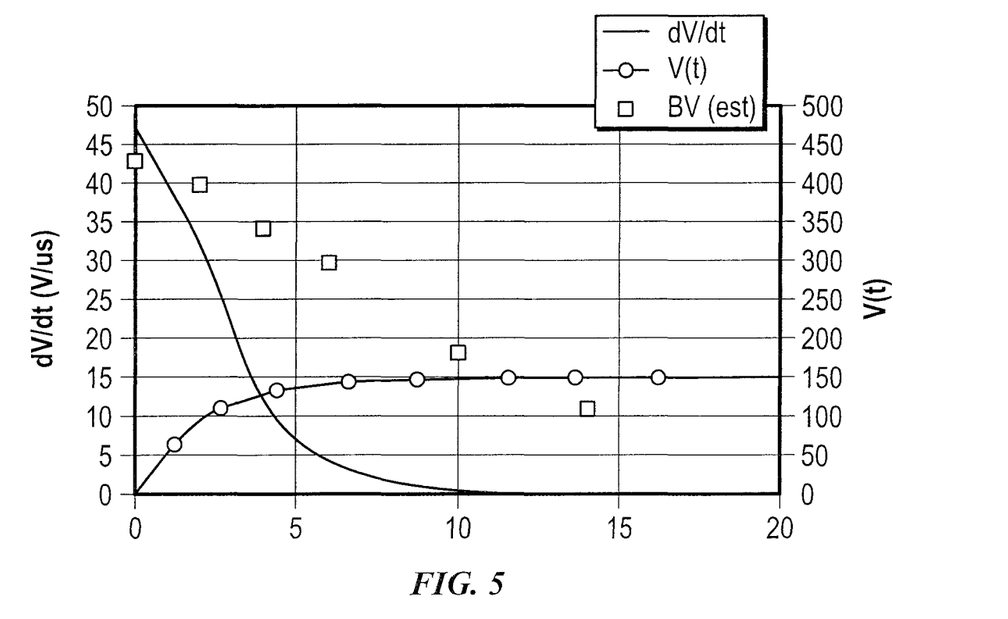
FIG. 5 is a graph of relationships between ramp rate, voltage, and breakdown voltage for low RC constant systems.

At lower voltages and lower RC values, as shown in the graph of FIG. 5, the voltage would be fully settled and the BV would be dropping as the slew rate approached zero. Using a 150V source, a 1 MΩ resistor, and 2 pF for the total capacitance (RC=2 μs), breakdown will occur at about 150V at about 12 μs. The start-up current will be 150 μA and the peak breakdown current of the 300 pC discharge will be ~0.3 Apk.

Obtaining reliable discharge while operating below 150V can be difficult, since many GDTs have "DC" breakdown not much lower than this. Reducing the total capacitance to 1 pF (nominally, the capacitance of the GDT and parasitic capacitances) would lower the RC time constant to 1 μs. The BV would remain close to 150V but the discharge would be ~150 pC. This approaches the nominal 100 pC considered to be the inception point in off-line tests of most medium voltage assets.

In embodiments of the present disclosure, the use of lower supply voltages offers lower cost, a wider range of available components, and easier safety compliance. It also reduces the pC discharge value that is created, which may be desirable to most users. The use of RC constants on the order of 1 μs is employed in one embodiment since the BV is almost equal to the nominal voltage over a wide range from below 125V to over 300V, allowing a wide tuning range of the discharge magnitude from nearly 100 pC to over 300 pC.

Using voltages below 400 VDC opens up many BJT and FET options for the switching, including optoisolation transistors, as well as the use of BJT or FET devices to rezero the stored energy between discharges. Using transistors to clamp the capacitors to zero during the time between one discharge and starting the next voltage ramp is used in one embodiment to overcome issues related to leakage currents The circuit 300 shown in FIG. 3 is suitable for integrating the GDT current through the discharge. However, an error term in the integrated current may accrue from the charging current of the capacitance. In principle, measuring before and after the discharge allows this to be corrected from the measurement. However, in practice, the events happen very quickly, and this correction may be imprecise.

Figure 6:
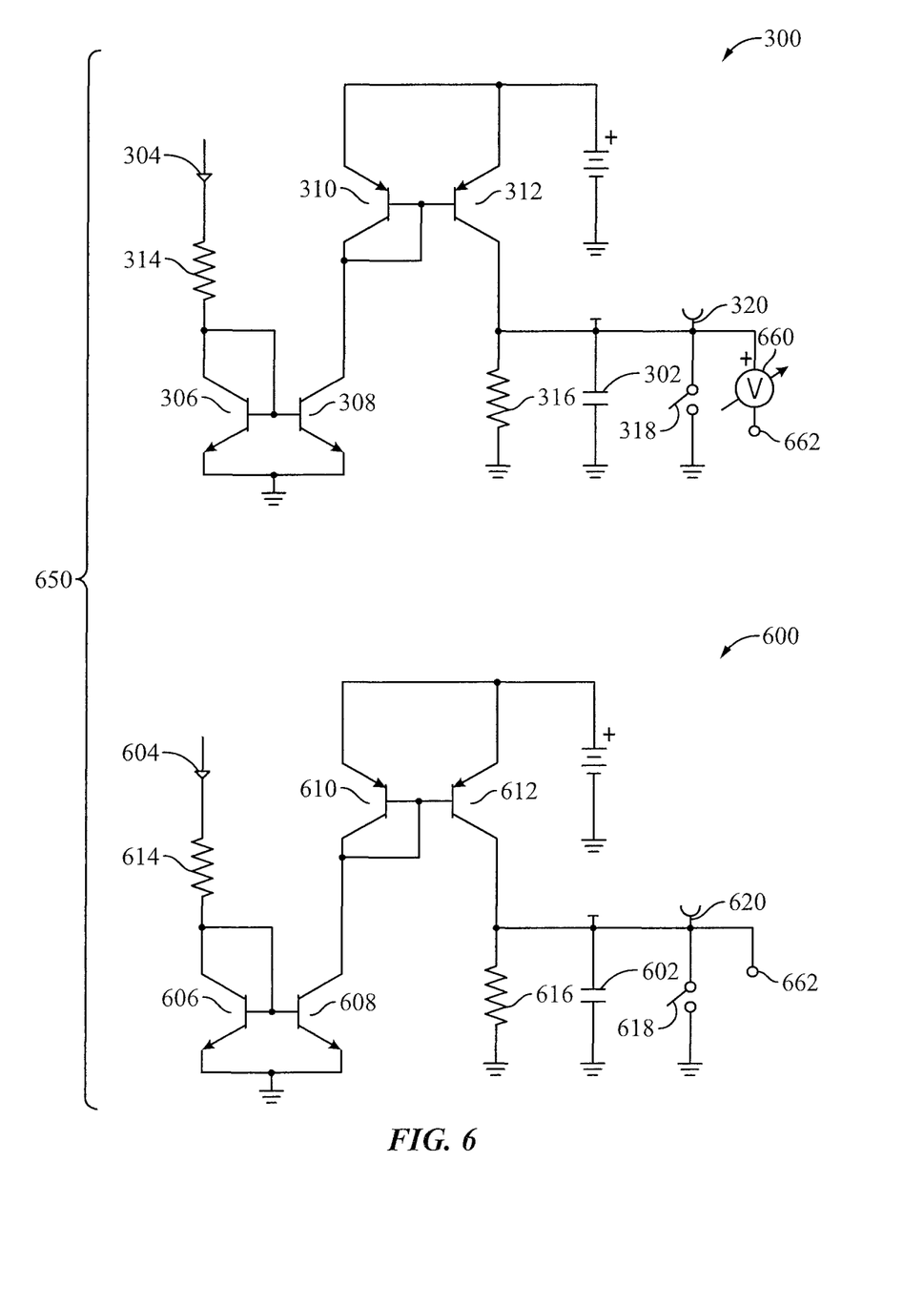
FIG. 6 is a diagram of a circuit according to an embodiment of the present disclosure.

FIG. 6 illustrates a circuit 650 according to another embodiment of the present disclosure. Circuit 650 comprises in one embodiment a differential circuit using two identical current measurement circuits, the first being identical to circuit 300 and having a current input from the GDT 108, and the second current measurement circuit 600 being identical to circuit 300, but having a current input at 604 from a matching capacitance.

Circuit 600 uses an integrating capacitor 602 in a current mirror 600 (comparable to current mirror 300) that is coupled to receive current at 604 from a capacitance that matches that of the GDT 108. Sinking the matching current at 604 into first transistor 606 produces an image current in transistor 608. The same current is sourced by transistor 610 and an image of that current is sourced by transistor 612 into integrator 602. Resistor 614 optionally limits the peak current as in circuit 300. With 1-5 pF of total matching capacitance and 1-5 Ω of series resistance from resistor 614, the RC time constant matches that of circuit 300.

The collector of transistor 612 is coupled to a parallel configuration of integration capacitor 602, an optional bleed resistor 616, and switch 618. Switch 618 is used in one embodiment to reset the integration after a discharge. Node 620 is a measurement point that connects to the ADC. In one embodiment, a power supply for transistors 610 and 612 matches the power supply of the analog to digital converter (ADC) and a microcontroller unit (MCU) for the system. The transfer efficiency of the current mirrors in circuit 600 is reproducible. This allows for the protection of the input transistor 606 from transients while using the current mirrors (606/608 and 610/612) to reduce the influence of transients into the measurement circuitry. In one embodiment, one node of the high voltage DC circuit may be connected to the low voltage instrumentation ground.

The difference between voltages at nodes 320 and 620 is attributed to the discharge. In this embodiment, circuit 300 includes meter 660 coupled between nodes 320 and 620. Meter 660 in one embodiment represents a differential amplifier or differential ADC input. Alternately, nodes 320 and 620 may be independently measured with respect to ground and their difference subsequently calculated.

A reference sensor is coupled to an output path of the second current mirror. The reference sensor is configured to sense a magnitude of the electrical current in the reference capacitor without electrical discharge. The meter 660 is coupled to the sensor and the reference sensor, the meter generating a difference between a magnitude at the output path of the first current mirror and the output path of the second current mirror.

Figure 7:
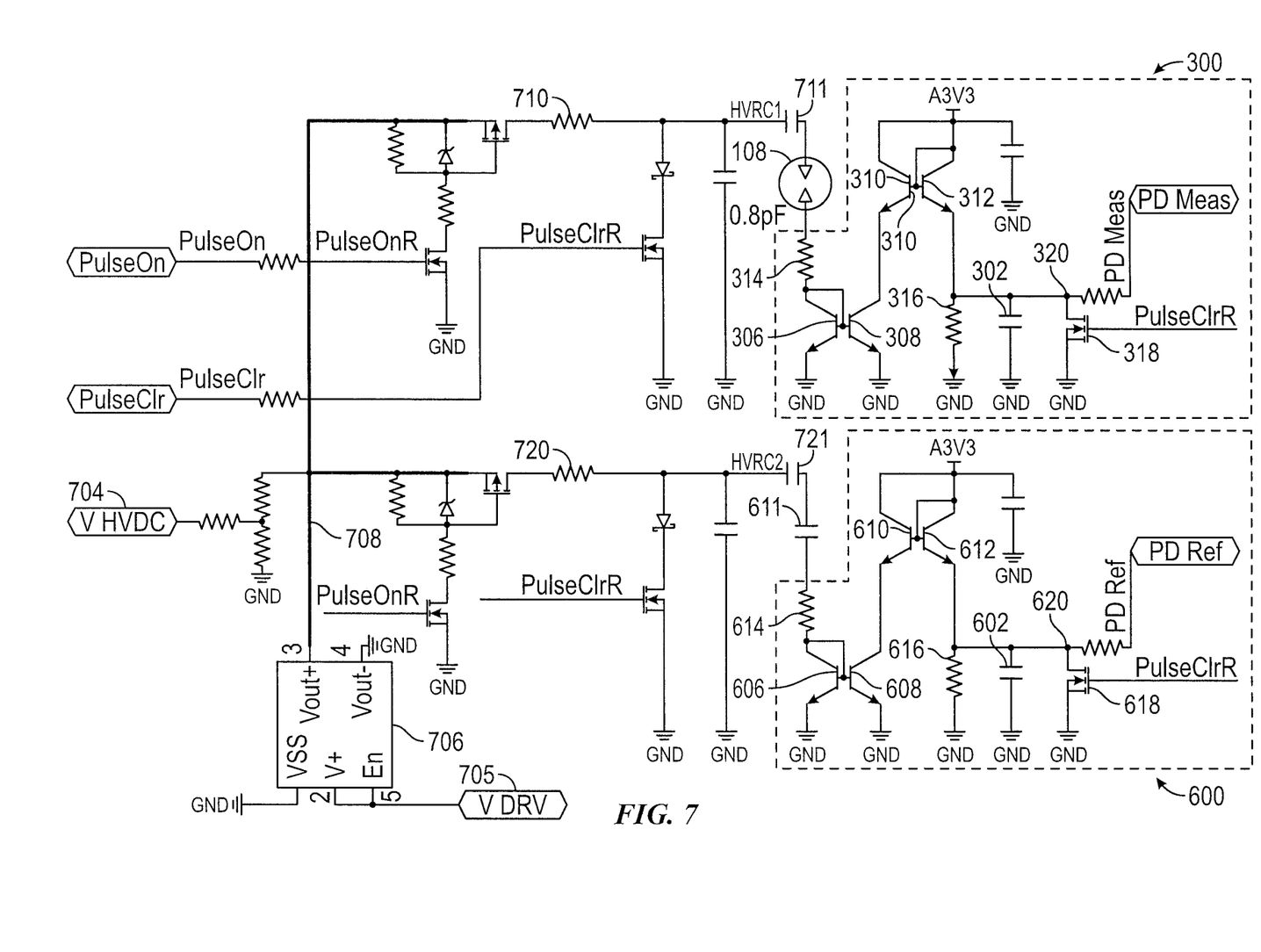
FIG. 7 is a schematic diagram of a circuit embodiment of the present disclosure.

Another embodiment 700, shown in FIG. 7, uses a closed loop system, in which a microprocessor such as controller 112 discussed above controls the ON/OFF state (via signal 705 being non-zero) and analog output voltage of a high voltage DC supply 706, a scaled replica of which is seen on V_HVDC as a feedback monitor 704. An exemplary range of the voltage control range has a lower limit slightly above the DC breakdown voltage of the GDT (e.g. 90V tube would want to operate down to 100 VDC). The upper limit of the exemplary range is a matter of technical choice; however numerous safety and component reliability considerations suggest 385 VDC as an upper limit and there is little incentive to operate at substantially higher values.

Power is also supplied by control voltage 706 which determines the proportional voltage on line 708 to feed a resistance (e.g., 710) and gas discharge tube 108 that returns the power supply 706 current through current measurement circuit 300. By measuring the integrated current during the discharge, the total charge transfer is measured and the microprocessor 702 may adjust the voltage level to alter the ramp rate up or down and thereby adjust the discharge voltage and total charge.

Other options for adjusting the total discharge include varying the resistance and capacitance as described above. In one embodiment, optoisolated transistors or P-channel MOSFETS are used to switch in or out parallel resistors. However, controlling the source voltage from the primary side is safer and more reliable, thereby being the most preferred embodiment.

Similarly, the use of switches to control shunt capacitances is also possible. The drawback is that existing solid-state switches have high capacitance and leakage currents relative to the typical requirements. For relatively infrequent use as a periodic self-test system, electromechanical relays are also a consideration.

Placing one or more relatively large series capacitances 711 between resistance 710 and GDT 108 and capacitance 721 between resistance 720 and reference capacitor 611 allows the effective capacitance of the GDT to be lowered. Optoisolator switches could be used to switch one or more element in or out of the circuit to make the effective capacitance controllable. The complication associated with this approach is that the varying series external capacitance not only adjust the RC time constant, but also form a voltage divider on the GDT, adding uncertainty to BV. Still further, the varying series external capacitance also fauns a voltage divider with the current mirror in distributing the incremental voltage increase. Finally, sufficiently large capacitances with low leakage currents and high voltage ratings add cost and add a source of variability.

As further shown in FIG. 7, reference current mirror subcircuit 600 is used as described above to allow for discharge determination through a meter such as meter 660 as shown in FIG. 6.

Microcontroller 112 controls further aspects of the circuitry of FIG. 7, including but not limited to, turning the power supply on and off, driving the DC voltage, clearing integrators 302 and 602 after a measurement, and the like.

Partial discharge synthesizer embodiments such as those described herein may be used to implement a unit or system controlled by the DCS or an edge analytics platform. Such embodiments would be amenable and compatible with operation inside energized assets. A host system could then request calibration signals during normal operation of the asset, providing built-in self-testing in critical infrastructure. The internal measurement system allows internal control and compensation of the calibration signals, allowing system monitoring apparatus to be reliably validated or calibrated. A fixed partial discharge reference such as those generated by embodiments of the present disclosure may be used to normalize, and possibly calibrate, an integrated detector.

In one embodiment, a MODBUS RTU (and/or Ethernet) interface is used to transfer command response packets. The compatibility with SCADA and DCS systems to allow on demand synthesis of controlled and calibrated levels of partial discharge are enabling of built-in self test (BIST) and self-calibrating measurement systems for electric power assets, as described in U.S. patent application Ser. No. 15/910,106, filed Mar. 2, 2018, entitled TRENDING FUNCTIONS FOR PARTIAL DISCHARGE, incorporated by reference.

Although the present embodiments have been described with specificity, workers skilled in the art will recognize that changes may be made in form and detail without departing from the scope of the disclosure. Although the subject matter has been described in language directed to specific environments, structural features and/or methodological acts, it is to be understood that the subject matter defined in the appended claims is not limited to the environments, specific features or acts described above as has been held by the courts. Rather, the environments, specific features and acts described above are disclosed as example forms of implementing the claims.

What is claimed is:

1. An apparatus for generating electrical discharge, comprising:
    a component that generates an electrical discharge;
    a measurement circuit configured to measure a magnitude of the electrical discharge;
    a controller configured to control the magnitudes of the electrical discharge;
    a first current mirror having an input coupled to a discharge path of the component that generates the electrical discharge; and
    a sensor, the sensor coupled to an output path of the first current mirror, the sensor sensing a magnitude of the electrical discharge.

2. The apparatus of claim 1, wherein the controller is further configured to correct a magnitude of a subsequent discharge based on a measured magnitude of at least one previous discharge.

3. The apparatus of claim 1, wherein the component that generates an electrical discharge is a gas discharge tube.

4. The apparatus of claim 3, and further comprising a switched inductance, wherein the electrical discharge is generated by the switched inductance applying a voltage impulse to the gas discharge tube.

5. The apparatus of claim 4, and further comprising a resistance element coupled in series between the switched inductance and the gas discharge tube, wherein the magnitude of the electrical discharge is controlled by adjusting a resistance of the resistance element.

6. The apparatus of claim 4, and further comprising a shunt capacitance element coupled in parallel with the gas discharge tube, wherein the magnitude of the discharge is controlled by adjusting a capacitance of the shunt capacitance element.

7. The apparatus of claim 4, and further comprising a capacitance element coupled in series with the gas discharge tube, wherein the magnitude of the discharge is controlled by adjusting a capacitance of the capacitance element.

8. The apparatus of claim 3, and further comprising:
a stepped DC voltage source; and
a resistance element coupled in series between the stepped DC voltage source and the gas discharge tube;
wherein the controller is further configured to generate the discharge by applying the stepped DC voltage through the resistance element to the gas discharge tube.

9. The apparatus of claim 8, wherein the controller is further configured to control the magnitude of the discharge by varying the stepped DC voltage.

10. The apparatus of claim 8, wherein the magnitude of the discharge is controlled by adjusting a resistance of the resistance element.

11. The apparatus of claim 8, and further comprising a shunt capacitance element coupled in parallel with the gas discharge tube, wherein the magnitude of the discharge is controlled by adjusting a capacitance of the shunt capacitance element.

12. The apparatus of claim 8, and further comprising a capacitance element coupled in series with the gas discharge tube, wherein the magnitude of the discharge is controlled by adjusting a capacitance of the capacitance element.

13. The apparatus of claim 1, wherein the measurement circuit comprises a sense resistor in a discharge path of the electrical discharge.

14. The apparatus of claim 1, wherein the measurement circuit comprises a Hall sensor in a discharge path of the electrical discharge.

15. The apparatus of claim 1, wherein the measurement circuit comprises a sense resistor coupled to the discharge path.

16. The apparatus of claim 1, wherein the measurement circuit comprises a Hall sensor measuring electrical discharge in the discharge path.

17. The apparatus of claim 1, wherein the measurement circuit comprises an integrating capacitance in a discharge path of the electrical discharge.

18. The apparatus of claim 1, and further comprising:
a second current mirror having an input coupled to a reference capacitance matching a capacitance of the component that generates the electrical discharge; and
a reference sensor, the reference sensor coupled to an output path of the second current mirror, the reference sensor sensing a magnitude of the electrical current in said reference capacitor without electrical discharge; and
a meter coupled to said sensor and said reference sensor, the meter generating a difference between a magnitude at the output path of the first current mirror and the output path of the second current mirror.

19. A system, comprising:
an electric power system comprising a partial discharge measurement component; and
a component that generates an electrical discharge;
a measurement circuit configured to measure a magnitude of the electrical discharge;
a controller configured to control the magnitude of the electrical discharge;
wherein the controller is further configured to perform a built-in self-test calibration process of measurement instruments integral to the system by:
sequentially instructing the system to perform a self-test of the system and its measurement instruments by generating and internally measuring an electrical discharge at a predetermined level in a predetermined pattern;
internally measuring a response to the self-test electrical discharge with the measurement circuit;
externally measuring a system response to the internally measured discharge;
determining a calibration state of the measurement circuit; and
using the calibration state to adjust the measurement circuit.

20. A method for controlling a reference partial discharge signal in an electric power system using a component that generates an electrical discharge, a measurement circuit configured to measure a magnitude of the electrical discharge, and a controller configured to control the magnitudes of the electrical discharge, the method, comprising:
generating a partial discharge for built in self test;
controlling an expected discharge magnitude of the partial discharge; and
measuring an actual discharge magnitude of the partial discharge.

21. The method of claim 20, and further comprising adjusting the actual discharge magnitude by adjusting the expected discharge magnitude in response to measured actual discharge magnitude.

22. The method of claim 20, and further comprising correcting a magnitude of a subsequent discharge based on a measured magnitude of one or more previous discharges.

23. The method of claim 20, wherein generating a partial discharge comprises generating with a gas discharge tube.

24. The method of claim 23, wherein controlling the expected discharge magnitude comprises generating the partial discharge with a switched inductance applying a pulse to the gas discharge tube.

25. The method of claim 24, wherein controlling an expected discharge magnitude comprises adjusting a resistance of a resistance element coupled in series between the switched inductance and the gas discharge tube.

26. The method of claim 23, wherein controlling the expected discharge magnitude comprises coupling a shunt capacitance element in parallel with the gas discharge tube and adjusting a capacitance of the shunt capacitance element.

27. The method of claim 23, wherein controlling an expected discharge magnitude comprises coupling a capacitance element in series with the gas discharge tube and controlling the magnitude of the discharge by adjusting a capacitance of the capacitance element.

28. The method of claim 23, wherein controlling the expected discharge magnitude comprises:
providing a stepped DC voltage source;
providing a resistance element coupled in series between the stepped DC voltage source and the gas discharge tube; and
generating the partial discharge applying the stepped DC voltage through the resistance element to the gas discharge tube.

29. The method of claim 28, and further comprising controlling the magnitude of the partial discharge by varying the stepped DC voltage.

30. The method of claim 28, and further comprising controlling the magnitude of the partial discharge by adjusting a resistance of the resistance element.

31. The method of claim 28, and further comprising controlling the magnitude of the partial discharge by adjusting a capacitance of a shunt capacitance element coupled in parallel with the gas discharge tube.

32. The method of claim 28, and further comprising controlling the magnitude of the partial discharge by adjusting a capacitance of a capacitance element coupled in series with the gas discharge tube.

33. The method of claim 32, wherein the capacitance element is coupled between the gas discharge tube and a return path of the discharge.

34. The method of claim 33, and further comprising integrating a discharge current from the gas discharge tube with the capacitance element.

35. The method of claim 23, and further comprising:
coupling an input of a first current mirror to a discharge path of the gas discharge tube; and
sensing a magnitude of the partial discharge at an output path of the first current mirror.

36. The method of claim 35, and further comprising:
coupling an input of a second current mirror to a reference capacitance matching a capacitance of the gas discharge tube;
sensing a magnitude of the current flowing in the reference capacitor in the absence of partial discharge at an output path of the second current mirror; and
determining a difference between the sensed magnitude at the output path of the first current mirror and the sensed magnitude at the output path of the second current mirror.

* * * * *